United States Patent [19]
Yamazaki

[11] 3,988,694
[45] Oct. 26, 1976

[54] AUTOMATIC LEVEL CONTROLLER
[75] Inventor: Seishi Yamazaki, Mito, Japan
[73] Assignee: Hitachi, Ltd., Japan
[22] Filed: Dec. 10, 1975
[21] Appl. No.: 639,587

[30] Foreign Application Priority Data
Dec. 20, 1974 Japan .............................. 49-145588

[52] U.S. Cl. ................................. 330/29; 325/410; 330/141; 330/207 P
[51] Int. Cl.² ........................................ H03G 3/30
[58] Field of Search .................. 179/1 VL; 325/410; 330/29, 141, 207 P, 129

[56] References Cited
UNITED STATES PATENTS
3,790,896  2/1974  Shimizu et al. ................. 330/141 X
3,893,038  7/1975  Omata et al. ..................... 330/29 X Primary Examiner—R. V. Rolinec
Assistant Examiner—Lawrence J. Dahl
Attorney, Agent, or Firm—Craig & Antonelli

[57] ABSTRACT

An automatic level controller comprising a switching transistor connected to the output stage of an audio amplifying circuit to be turned off when the output signal of the audio amplifying circuit attains a predetermined level, a control transistor connected to the input stage of the audio amplifying circuit for bypassing to the ground a portion of the audio signal applied to the audio amplifying circuit thereby controlling the audio level, a diode adapted to be turned on in response to the turn-off of the switching transistor for supplying current from a power source to the audio level control transistor as an audio level control signal, and a time constant circut for setting the attack period and release period of control by the audio level control signal.

8 Claims, 6 Drawing Figures

AUTOMATIC LEVEL CONTROLLER

BACKGROUND OF THE INVENTION

1. Field of the Invention

This invention relates to an automatic level controller for audio amplifiers used in transceivers, tape recorders and like audio equipments.

2. Description of the Prior Art

A conventional automatic controller generally used in transceivers and the like will be described with reference to FIGS. 1 and 4 before describing the present invention in detail.

Referring to FIG. 1, such a known automatic level controller includes audio amplifying circuits 3 and 5, low-frequency transformers 4 and 6, and a transmitting circuit 7 including modulating means. The audio amplifying circuit 3 is connected at the input terminal 31 thereof to a microphone 1 through an input resistor 2, and at the output terminal thereof to the other audio amplifying circuit 5 through the transformer 4. The output of the amplifying circuit 5 is coupled to the primary winding of the transformer 6. The transmitting circuit 7 has an output terminal 71. A diode 20 is connected at the cathode thereof to a power source +B through the secondary winding 62 of the low-frequency or modulation transformer 6 and to an input terminal of the transmitting circuit 7. The anode of the diode 20 is connected to the power source +B through a resistor 21 and is grounded through another resistor 22. Further, the anode of the diode 20 is connected to the base of a transistor 14 through a capacitor 23, a rectifying circuit 24 consisting of diodes 241 and 242, and a time constant circuit 25 consisting of a resistor 251 and a capacitor 252. The diode 20 is normally reverse biased by the resistors 21 and 22. The transistor 14 functions to control the audio level of an audio signal applied to the audio amplifying circuit 3, and the collector of the transistor 14 is connected to the input terminal 31 of the audio ampifying circuit 3 to which the resistor 2 is connected, while the emitter thereof is directly grounded.

In operation, an audio signal applied to the microphone 1 is amplified by the audio amplifying circuits 3 and 5 and then passes through the modulation transformer 6 to be applied to the transmitting circuit 7. The signal appearing across the secondary winding 62 of the modulation transformer 6 provides the cathode potential of the diode 20, but the level of this signal varies depending on the magnitude of the audio input signal, whereas the anode potential of the diode 20 is determined by two dividing resistors 21 and 22. When the input signal has a large amplitude large enough to provides a low cathode potential of the diode 20 which is lower than the anode potential by such an extent enabling to turn the diode 20 on, the diode 20 becomes turned on, and this signal passes through the diode 20 to appear across the voltage-dividing resistor 22 as a pulse signal. The maximum value of the amplitude of this pulse signal appearing across the resistor 22 is determined by the d.c. terminal voltage of the resistor 22 and is equal to the d.c. terminal voltage. Therefore, the maximum value of the amplitude of the pulse signal appearing across the resistor 22 can be varied by varying the d.c. terminal voltage of the resistor 22. This pulse signal is rectified by the rectifying circuit 24, and this rectified signal is applied through the time constant circuit 25 to the base of the audio signal level control transistor 14. The transistor 14 is forward biased by this rectified signal and controls the audio level by dividing the audio signal output of the microphone 1 by the internal impedance of the transistor 14 and resistor 2. The curve B shown in FIG. 4 represents the audio level control characteristic of the conventional level controller shown in FIG. 1. The curve A shown in FIG. 4 represents the characteristic observed when any level controller is not provided.

In the conventional level controller having a structure as above described, the diode 20 is turned on only when the amplitude of the signal appearing across the secondary winding 62 of the modulation transformer 6 exceeds a predetermined level (in this case, this predetermined level is the anode potential level of the diode 20 and the signal level appearing at the secondary winding 62 should be lower than the anode potential), and the signal passing through the diode 20 is rectified to provide the control signal for the audio level control transistor 14. However, this conventional level controller has various defects as enumerated below. Firstly, the audio level control range is quite narrow. That is, the controllable range of the conventional level controller is only 30 dB as apparent from the characteristic curve B shown in FIG. 4. Secondly, the audio level control starts at a point $B_o$ which is earlier than desired as apparent also from the characteristic curve B shown in FIG. 4. That is, this audio level control starting point $B_o$ is considerably lower than the 100 percent modulation line or clipping level shown in FIG. 4. As a result, the control effect of the conventional audio level controller is quite gradual and insufficient. These defects are attributable to the fact that the control signal level applied to the audio level control transistor 14 is low.

This audio level control starting point $B_o$ can be further delayed and shifted toward the clipping level shown in FIG. 4 when the d.c. terminal voltage of the resistor 22 in FIG. 1 is reduced for increasing reverse bias voltage for the diode 20. However, this results in further narrowing of the audio level controllable range. It is therefore undesirable to excessively shift and delay the audio level control starting point $B_o$. On the other hand, when the d.c. terminal voltage of the resistor 22 is increased for reducing reverse bias voltage for the diode 20, the magnitude of the control signal passing through the diode 20 can be increased so that a satisfactorily effective audio level control can be achieved with this control signal of increased magnitude. However, this results in an undesirable situation such that the audio level control starts earlier than the point $B_o$ shown in FIG. 4, that is, the audio level control is initiated at a position which is considerably lower than the clipping level for the input signal. This audio level control starting point $B_o$ is desirably as close to the clipping level as possible.

Thirdly, in the conventional level controller, due to variations of the power source voltage the d.c. terminal voltage of the resistor 22 necessarily varies, hence variations of the audio level control range of the gain control signal appearing across the resistor 22 occur. This defect is attributable to the fact that the audio level control range of the gain control signal is limited by the d.c. terminal voltage of the resistor 22.

SUMMARY OF THE INVENTION

It is an object of the present invention to provide a novel and improved automatic level controller of the kind above described which can control the audio level over a range considerably wider than heretofore.

Another object of the present invention is to provide an automatic level controller by which the audio level control can be started at a point nearer to the clipping level than heretofore, that is, starting of the audio level control can be delayed as compared with that in the conventional level controller, and which can ensure satisfactorily effective control of the audio level,.

Still another object of the present invention is to provide an automatic level controller whose audio level control characteristic is not adversely affected in any way by variations of the power source voltage.

Yet another object of the present invention is to provide an automatic level controller in which the attack period and release period of control can be freely selected.

The present invention which attains the above objects comprises a switching circuit which is placed in one of the on state and off state depending on whether or not the output of an audio amplifying circuit for amplifying an audio input signal attains a predetermined magnitude or amplitude, means for applying either one of constant voltages of different levels to a time constant circuit depending on the on state or off state of the switching circuit, and means for applying the output voltage of the time constant circuit to the input terminal of an audio level control element in an audio level control circuit, so that, only when the output of the audio amplifying circuit exceeds a predetermined magnitude or amplitude, the audio level control element can be turned on and a portion of the audio input signal applied to the input terminal of the audio amplifying circuit can be bypassed to the ground thereby controlling the audio level of the audio input signal applied to the audio amplifying circuit.

According to the present invention, the audio level control can be started at a level quite close to the 100 percent modulation level, and yet the level controllable range can be widened due to the fact that the level controller is controlled on the basis of the constant voltages of different levels instead of the audio output itself of the audio amplifying circuit. Further, according to the present invention, the audio level control characteristic of the level controller is free from any variations even when the power source voltage is subject to variations.

DESCRIPTION OF THE PREFERRED EMBODIMENTS

Figure 1:
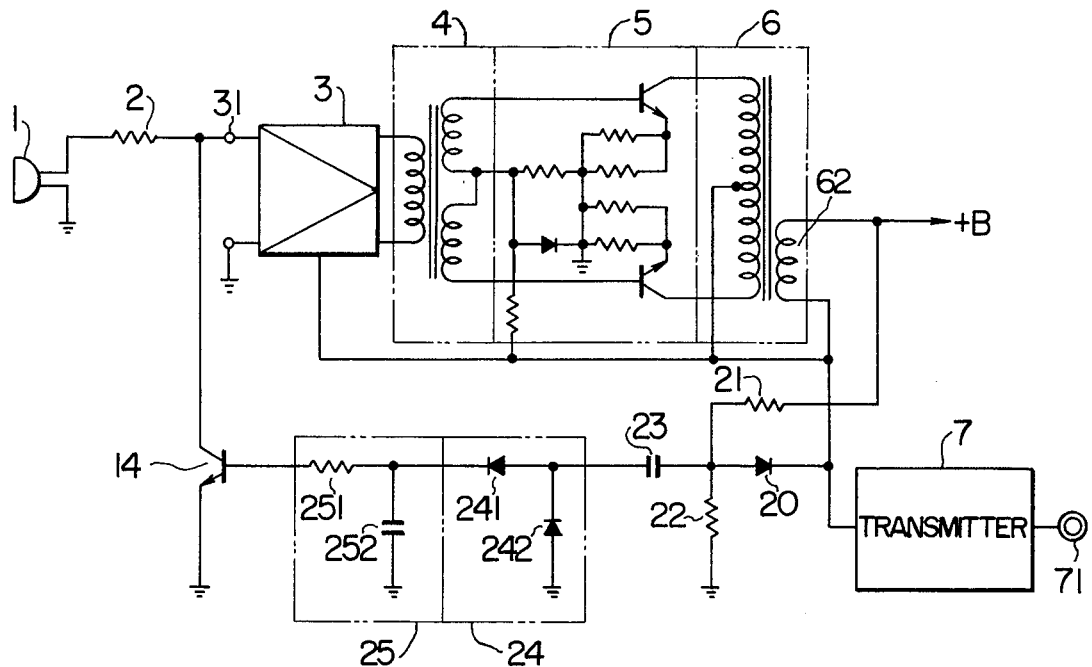
FIG. 1 is a circuit diagram of a conventional automatic level controller applied, for example, to a transmitter section of a transceiver.
Figure 2:
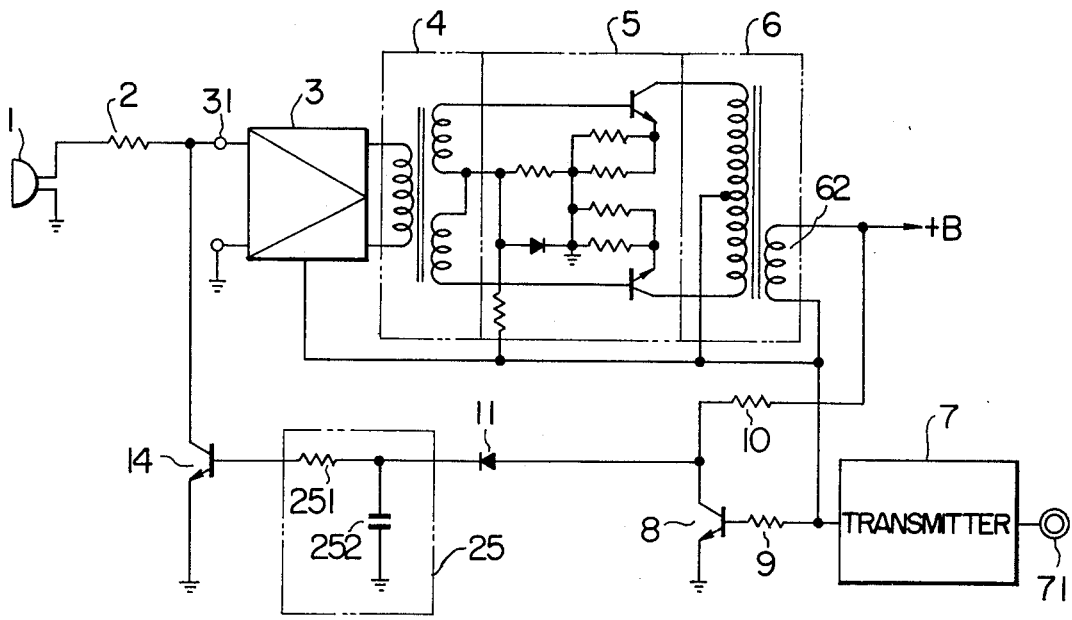
FIG. 2 is a circuit diagram of an embodiment of the automatic level controller according to the present invention.

FIG. 2 is a circuit diagram of an embodiment of the automatic level controller according to the present invention. In FIG. 2, the reference numerals 1, 2, 3, 4, 5, 6, 7, 14, 24, 25, 31, 62 and 71 denote like parts appearing in FIG. 1.

Referring now to FIG. 2, a switching transistor 8 is connected at the base thereof to a power source +B through a current limiting resistor 9 and through the secondary winding 62 of an output transformer 6. This base is also connected to the input terminal of a transmitting circuit 7 through the resistor 9. The emitter of this switching transistor 8 is grounded directly, and the collector thereof is connected to the power source +B through a protective resistor 10 and also to the anode of a switching diode 11. The cathode of this switching diode 11 is connected through a time constant circuit 25 to the base of an audio level control transistor 14. The collector of this audio level control transistor 14 is connected to the input terminal 31 of an audio amplifying circuit 3 to which a microphone 1 is connected through an input resistor 2, and the emitter thereof is grounded directly.

In the automatic level controller of the present invention shown in FIG. 2, the operating mode of the switching transistor 8 is such that it is continuously kept in the on state until a level, which is lower than the 100 percent modulation level or clipping level by the base-to-emitter voltage $V_{be}$ of the transistor 8, is reached with an increase in the amplitude of the audio signal appearing across the secondary winding 62 of the output transformer 6, while it is turned off when the above level is reached. Further, the operating mode of the switching diode 11 is such that it is kept in the off state when the transistor 8 is in the on state, while it is turned on in response to the turn-off of the transistor 8.

When now the switching transistor 8 is turned off due to an increase in the amplitude of the audio input signal, the collector potential of the transistor 8 increases from zero to the power source voltage level, and thus the diode 11 is forward biased to be turned on. When the diode 11 is thus turned on, the capacitor 252 in the time constant circuit 25 is immediately charged with the power source voltage, and the audio level control transistor 14 is turned on by being forward biased by the voltage across the capacitor 252. As a result, a portion of the audio signal output of the microphone 1 is bypassed to the ground through the transistor 14 so that the audio level control operation is started. The attack period of control is determined by the time constant which is determined by the resistance of the resistor 10 and the capacitance of the capacitor 252.

When the switching transistor 8 is turned on due to a decrease in the amplitude of the audio input signal, the collector potential of the transistor 8 is lowered to the zero ground level, and the switching diode 11 is reverse biased to be turned off. When the diode 11 is thus turned off, the capacitor 252 discharges through the resistor 251 in the time constant circuit 25. The audio level control transistor 14 continues to control the audio level during this discharging period.

As is commonly known, the amplitude of an audio signal varies greatly over a wide range. It is therefore required that the audio level control transistor 14 can control an audio signal portion of excessively large amplitude level within a short attack period and that the gain of the audio level control transistor 14 must be restored within a suitable release period so that the transistor 14 can operate reliably for the control of another audio signal portion of excessively large amplitude level applied after the attack period. It is generally said that adequate values of the attack period and release period are less than 0.1 second and more than 0.5 to 2 seconds respectively.

The term "attack period" used herein is to denote the period ranging from the turn-off of the transistor 8 and also the turn-on of the diode 11 to the turn-on of the audio level control transistor 14 by the voltage appearing across the capacitor 252 in the time constant circuit 25. The term "release period" used herein is to denote the period ranging from the turn-on of the transistor 8 and the turn-off of the diode 11 to the turn-off of the audio level control transistor 14 by discharging the charge in the capacitor 252 in the time constant circuit 25.

However, "message interruption" tends to occur when the attack period is excessively short and the release period is excessively long. The term "message interruption" refers to a transient phenomenon in which sudden application of an audio signal input portion of excessively large amplitude results in an abrupt reduction of the gain and an otherwise continuous message is heard in interrupted fashion due to inaudibility of a subdued voice portion following a loud voice portion.

Such an undesirable phenomenon is eliminated according to the present invention. In the present invention, in response to the turn-on of the transistor 8 followed by the turn-off of the diode 11, the capacitor 252 in the time constant circuit 25 discharges through the resistor 251 within a suitable release period which can be suitably selected. Thus, this release period can be freely selected to be most suitable for obviating occurrence of the undesirable message interruption.

Figure 4:
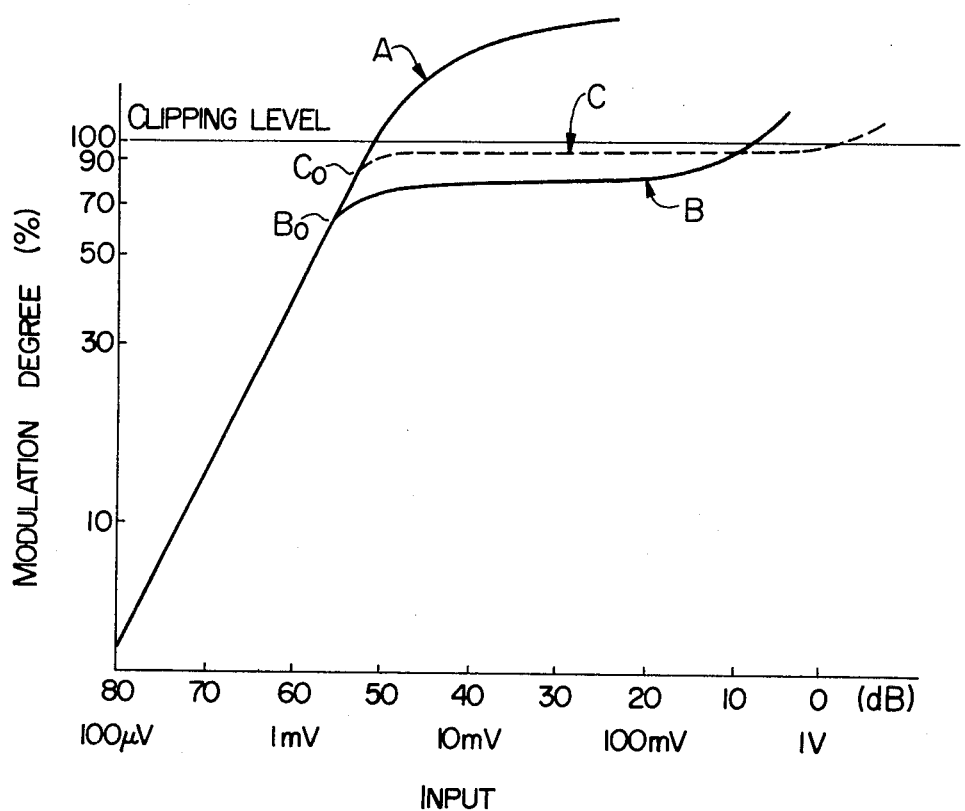
FIG. 4 is a graph showing the audio level control characteristic of the level controller of the present invention for comparison with that of the conventional one shown in FIG. 1.

The dotted curve C shown in FIG. 4 represents the audio level control characteristic of the controller structure shown in FIG. 2 under the following conditions:

| Resistor 2 | 10 kΩ |
| Resistor 9 | 47 kΩ |
| Resistor 10 | 3.3 kΩ |
| Resistor 251 | 1 kΩ |
| Transistors 8, 14 | 2SC458 |
| Diode 11 | 1S2076 |
| Capacitor 252 | 33 μF |
| Power source | 12 V |

It will be seen from this characteristic curve C that the audio level control can be started at a point $C_o$ which exists at about 90 percent of the clipping level, and the audio level can be satisfactorily controlled over a wide range of 53 dB between the level control starting point $C_o$ and the clipping occurring level. Such good results can be obtained due to the fact that the power source voltage is utilized as the control signal for the audio level control transistor 14. Further, the switching operation of the transistor 8 and diode 11 is not adversely affected in any way even when the power source voltage may vary slightly for some reasons. Therefore, no variation occurs in the audio level control range of the gain control signal regardless of slight variations of the power source voltage, that is, no variation occurs in the magnitude of the signal which is applied to the base of the audio level control transistor 14 for controlling the gain of this transistor. Further, by varying the time constant of the time constant circuit 25, it is possible to freely select both the attack period of control by the audio level control signal and the release period of the audio level control.

Figure 3:
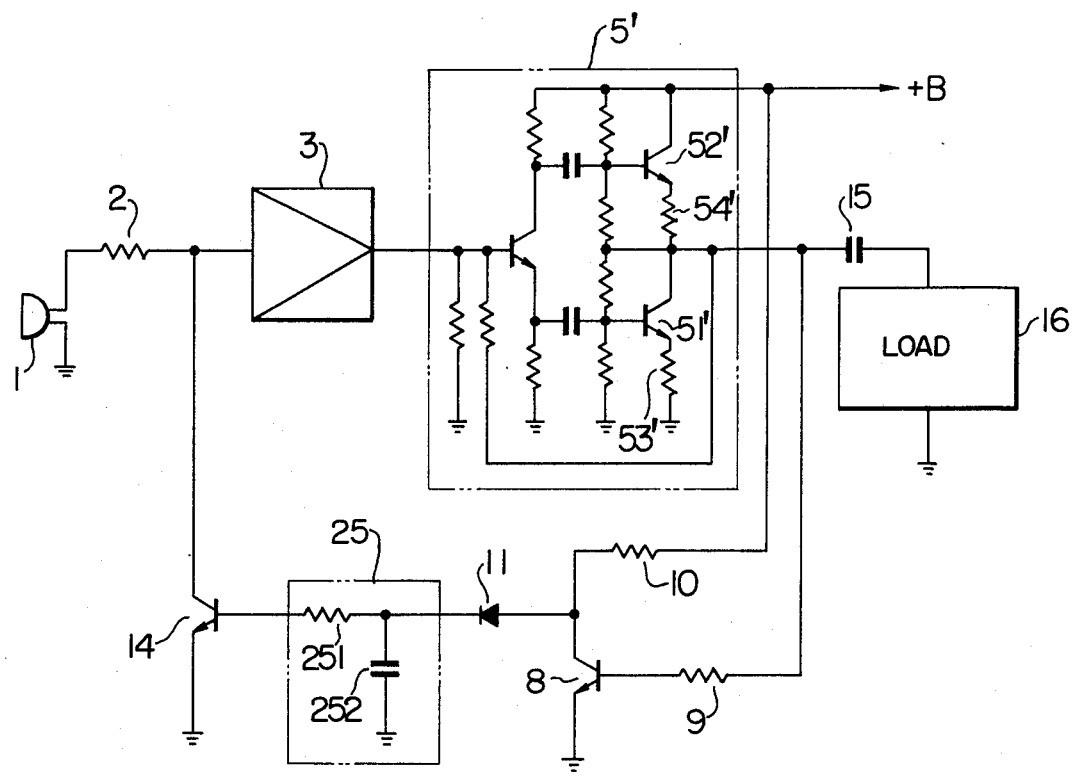
FIG. 3 is a circuit diagram of another embodiment of the present invention.

FIG. 3 shows another embodiment of the present invention in which an SEPP type OTL amplifying circuit is used as an output amplifying circuit.

Referring to FIG. 3, a switching transistor 8 is connected at the base thereof to the collector of an output transistor 51' in an output amplifying circuit 5' through a current limiting resistor 9 and to the emitter of another output transistor 52' in the output amplifying circuit 5' through the resistor 9 and another resistor 54'. Further, the base of this switching transistor 8 is grounded through the resistor 9, a capacitor 15 and a load 16. The collector of the transistor 8 is connected through the resistor 10 to the collector of the output transistor 52' as well as to a power source +B. Other parts, circuit connections and circuit operation are the same as those described with reference to FIG. 2, and therefore, any detailed description is unnecessary. It is apparent that the functional effect of the level controller shown in FIG. 3 is similar to that of the level controller shown in FIG. 2.

Figure 5:
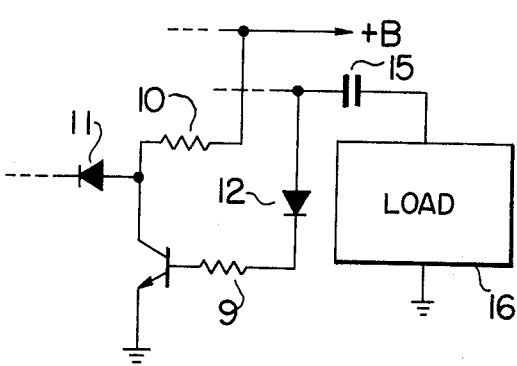
FIGS. 5 and 6 are partial circuit diagrams of other embodiments of the present invention.
Figure 6:
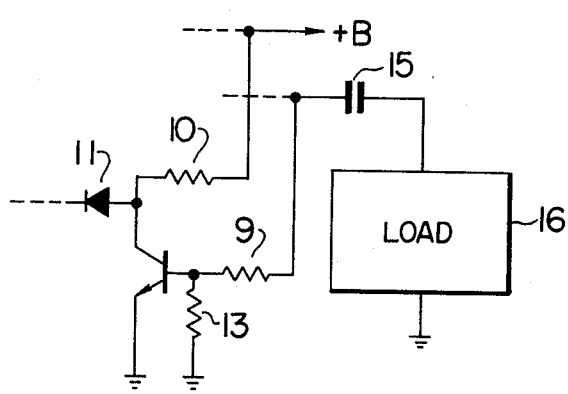

In the embodiment shown in FIG. 3, resistors 53' and 54' are connected to the emitter of the respective output transistors 51' and 52' in the OTL output amplifying circuit 5'. In a partial modification of this embodiment, a diode 12 is connected in series with the resistor 9 as shown in FIG. 5 or a voltage-dividing resistor 13 is connected across the base and emitter of the switching transistor 8 as shown in FIG. 6 so as to vary the operating level of the switching transistor 8.

In the embodiments above described, the diode 11 is connected between the switching transistor 8 and the time constant circuit 25. However, this diode 11 can be eliminated when the collector potential of the switching transistor 8, which is applied to the base of the audio level control transistor 14 through the time constant circuit 25 in the on state, is selected to be a value which will not turn on the transistor 14.

Further, in the embodiments above described, the switching transistor 8 is biased so as to be turned on when the amplitude of the audio output signal is small, and turned off when the amplitude attains or exceeds a predetermined level. However, this switching transistor 8 may be biased so as to be turned off when the amplitude of the audio output signal is small, and turned on when the amplitude attains or exceeds a predetermined level, so that current from the power source +B can be supplied to the time constant circuit 25 through the collector-emitter circuit of this switching transistor 8.

I claim:

1. An automatic level controller comprising: an audio terminal; an audio output terminal; a power source; an audio amplifying circuit connected between said audio input and output terminals for amplifying an audio signal applied to said audio input terminal and applying an amplified audio output signal to said audio output terminal; an audio level control circuit connected to the input terminal and adapted to be turned on and off by an audio level control signal applied thereto for controlling the audio level of the audio input signal applied to said audio amplifying circuit by bypassing to the ground a portion of said audio input signal; a switching circuit connected to said power source and operatively supplied with the output signal of said audio amplifying circuit and adapted to be turned on and off depending on whether or not the level of the audio output signal of said audio amplifying circuit exceeds a predetermined level, said switching circuit delivering one of two constant outputs having different potential levels from each other depending on the on state and off state; and a time constant circuit for setting the attack period and release period of control by said audio level control circuit in response to the application of the constant potential output from said switching circuit, wherein one of said constant potential outputs of said switching circuit applied through said time constant circuit to said audio level control circuit is so selected to cause said audio level control circuit to be turned on when the level of said audio output signal of said audio amplifying circuit exceeds said predetermined level.

2. An automatic level controller as claimed in claim 1, wherein said switching circuit comprises: a switching element operatively turned on and off respectively when the level of said audio output signal of said audio amplifying circuit does not exceed and exceeds said predetermined level, said switching element being connected in series with said power source for producing said constant potential outputs thereacross depending on the on state and the off state; and means for applying to said time constant circuit said constant potential outputs appearing across said switching element.

3. An automatic level controller as claimed in claim 2, wherein said constant potential output applying means comprises a diode having an anode and a cathode, said time constant circuit being connected across said switching element through said diode, and said diode being turned off and on in response to the turn-on and turn-off of said switching element, respectively, so that current from said power source can be supplied as said audio level control signal to said audio level control circuit when said diode is turned on.

4. An automatic level controller as claimed in claim 2, wherein said switching circuit comprises: a switching transistor acting as said switching element; a first resistor; and a second resistor, the input electrode of said switching transistor being connected through said first resistor and an output circuit of the audio amplifying circuit to said power source, while the output electrodes of said switching transistor are connected across said power source through said second resistor.

5. An automatic level controller as claimed in claim 2, wherein said diode is connected in the forward direction between said switching circuit and said time constant circuit, and is biased by said first and second resistors in such a manner that it is turned off and on when said switching transistor is turned on and off, respectively.

6. An automatic level controller as claimed in claim 4, wherein a second diode is connected in the forward direction in series with said current limiting first resistor between the input electrode of said switching transistor and the output circuit of said audio amplifying circuit.

7. An automatic level controller as claimed in claim 4, wherein a third resistor is connected across the base and emitter of said switching transistor.

8. An automatic level controller comprising: an audio input terminal; an audio output terminal; a power source; an audio amplifying circuit connected between said audio input and output terminals for amplifying an audio signal supplied to said audio input terminal and providing an amplified audio signal to said audio output terminal; an audio level control transistor having one input electrode and two output electrodes and connected at said output electrodes between the ground and the input terminal for controlling the audio level of the audio input signal applied to said audio amplifying circuit by bypassing to the ground a portion of said audio input signal; a protective resistor; a current limiting resistor; a time constant circuit; a switching transistor having one input electrode and two output electrodes and connected at said input electrode through said current limiting resistor and an output circuit of said audio amplifying circuit to said power source, and at one of said output electrodes to said power source through said protective resistor and grounded at the other one of said output electrodes, said switching transistor being switched over from one state to the other when the level of the audio output signal of said audio amplifying circuit exceeds a predetermined level; and a switching diode having two electrodes and connected at one electrode thereof to said power source through said protective resistor and at the other electrode thereof to said input electrode of said audio level control transistor through said time constant circuit, said switching diode being switched over from one state to the other in response to the switching of said switching transistor as a result of the detection of the audio output level thereby supplying current from said power source as an audio level control signal to said input electrode of said audio level control transistor.

* * * * *